US008257906B2

(12) United States Patent
Van Brocklin et al.

(10) Patent No.: US 8,257,906 B2
(45) Date of Patent: Sep. 4, 2012

(54) MULTI-LAYERED RADIATION IMAGEABLE COATING

(75) Inventors: Andrew L. Van Brocklin, Corvallis, OR (US); Susan E. Bailey, Corvallis, OR (US); Makarand P. Gore, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1619 days.

(21) Appl. No.: 11/393,536

(22) Filed: Mar. 29, 2006

(65) Prior Publication Data

US 2007/0238045 A1 Oct. 11, 2007

(51) Int. Cl.
*G03F 7/00* (2006.01)
*G11B 7/24* (2006.01)

(52) U.S. Cl. .................................. 430/270.11; 430/321

(58) Field of Classification Search .................. 430/333, 430/339, 386, 383, 384, 388, 270.11, 321
See application file for complete search history.

(56) References Cited

U.S. PATENT DOCUMENTS

| | | | | |
|---|---|---|---|---|
| 5,240,900 | A * | 8/1993 | Burberry | 503/227 |
| 6,015,896 | A | 1/2000 | Mistry et al. | |
| 6,025,486 | A | 2/2000 | Mistry et al. | |
| 6,492,076 | B1 * | 12/2002 | Goswami et al. | 430/21 |
| 6,664,020 | B1 * | 12/2003 | Warner et al. | 430/253 |
| 7,314,704 | B2 * | 1/2008 | Gore | 430/337 |
| 2004/0265552 | A1 | 12/2004 | Lutz | |
| 2007/0105039 | A1 * | 5/2007 | Kasperchik et al. | 430/270.1 |
| 2007/0238613 | A1 * | 10/2007 | Brocklin et al. | 503/226 |

FOREIGN PATENT DOCUMENTS

| | | | |
|---|---|---|---|
| DE | 19955383 | A1 | 5/2001 |
| EP | 0738609 | A1 | 10/1996 |
| EP | 0716135 | B1 | 9/1999 |
| WO | WO 98/19868 | | 5/1998 |
| WO | WO 2005/120849 | A | 12/2005 |

OTHER PUBLICATIONS

PCT International Search Report; Patent Application No. PCT/US2007/064921; Filed Mar. 26, 2007; Report issued Oct. 10, 2007.

* cited by examiner

*Primary Examiner* — Cynthia Kelly
*Assistant Examiner* — Connie P Johnson

(57) ABSTRACT

A radiation imageable coating includes a first thermochromic layer including a bleachable antenna dye and a second thermochromic layer including a non-bleachable antenna dye.

15 Claims, 3 Drawing Sheets

MULTI-LAYERED RADIATION IMAGEABLE COATING

BACKGROUND

Compositions that produce a color change upon exposure to energy in the form of light or heat are of great interest in generating images on a variety of substrates. For example, data storage media provide a convenient way to store large amounts of data in stable and mobile formats. For example, optical discs, such as compact discs (CDs), digital video disks (DVDs), or other discs allow a user to store relatively large amounts of data on a single relatively small medium. Traditionally, commercial labels were frequently printed onto optical discs by way of screen printing or other similar methods to aid in identification of the contents of the disk.

Current efforts have been directed to providing consumers with the ability to store data on optical disks using drives configured to burn data on recordable compact discs (CD-R), rewritable compact discs (CD-RW), recordable digital video discs (DVD-R), rewritable digital video discs (DVD-RW), and combination drives containing a plurality of different writeable drives, to name a few. The optical disks used as storage mediums frequently have two sides: a data side configured to receive and store data and a label side. The label side is traditionally a background on which the user hand writes information to identify the disc.

Recent developments have provided for the imaging of a dye-containing coating with the lasers of commercially available optical disc drives. However, multi-layered dye-containing coatings configured to be imaged with commercially available lasers are typically very slow in forming images on the label side of optical disks.

SUMMARY

According to one exemplary embodiment, a radiation imageable coating includes a first thermochromic layer including a bleachable antenna dye and a second thermochromic layer including a non-bleachable antenna dye.

DESCRIPTION OF DRAWINGS

The accompanying drawings illustrate various embodiments of the present system and method and are a part of the specification. The illustrated embodiments are merely examples of the present system and method and do not limit the scope of the disclosure.

Throughout the drawings, identical reference numbers designate similar, but not necessarily identical, elements.

DETAILED DESCRIPTION

Figure 1:
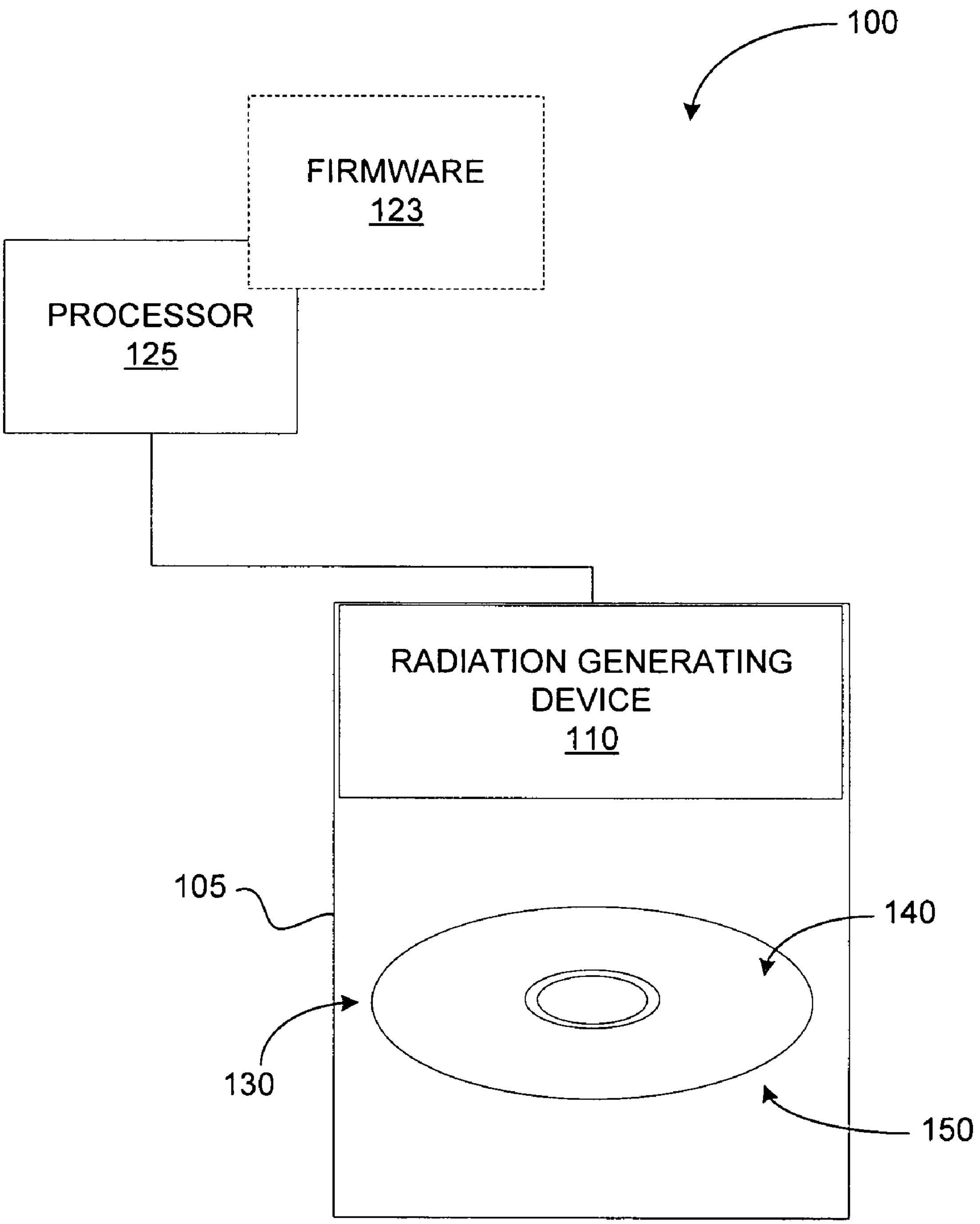
FIG. 1 illustrates a schematic view of a media processing system according to one exemplary embodiment.

The present exemplary systems and methods provide for the preparation of a multi-phase radiation imageable thermochromic coating having improved marking speed. In particular, a radiation-curable radiation imageable coating is described herein that can be imaged with a radiation generating device while exhibiting high marking speed. According to one exemplary embodiment, the present three-layer radiation imageable thermochromic coating has two or more bleachable antenna dyes dispersed and/or dissolved in various layers of the coating, and a third antenna dye that remains active in the thermochromic coating both before and after a bleaching operation. Further details of the present coating, as well as exemplary methods for forming coatings on a desired substrate will be described in further detail below.

The present descriptions and exemplary systems are described in terms of a three layered/phased system to detail the formation of a color image and for ease of explanation. However, describing the present exemplary systems and methods in terms of a three-layered system in no way limits the scope of the claims to only a three-layered system, rather it applies to any system comprising multiple layers and/or antenna dyes. The present descriptions are also described in terms of using two radiation sources of different wavelengths, which in no way limits the scope of the claims to use of only two radiation sources, but applies to use of any number of radiation sources.

As used in the present specification, and in the appended claims, the term "radiation imageable discs" is meant to be understood broadly as including, but in no way limited to, audio, video, multi-media, and/or software disks that are machine readable in a CD and/or DVD drive, or the like. Non-limiting examples of radiation imageable disc formats include, writeable, recordable, and rewriteable disks such as DVD, DVD–R, DVD–RW, DVD+R, DVD+RW, DVD-RAM, CD, CD-ROM, CD-R, CD-RW, and the like.

For purposes of the present exemplary systems and methods, the term "color" or "colored" refers to absorbance and reflectance properties that are preferably visible, including properties that result in black, white, or traditional color appearance. In other words, the terms "color" or "colored" includes black, white, and traditional colors, as well as other visual properties, e.g., pearlescence, reflectivity, translucence, transparency, etc.

In the following description, for purposes of explanation, numerous specific details are set forth in order to provide a thorough understanding of the present systems and methods for forming a radiation imageable coating with at least one bleachable antenna dye. It will be apparent, however, to one skilled in the art that the present systems and methods may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Exemplary Structure

FIG. 1 illustrates a schematic view of a media processing system (100), according to one exemplary embodiment. As will be described in more detail below, the illustrated media processing system (100) allows a user, among other things, to expose a radiation imageable surface with coatings of the present exemplary compositions, register an image on the coatings, and use the imaged object for a variety of purposes. For example, according to one exemplary embodiment, a radiation imageable data storage medium (radiation imageable disc) may be inserted into the media processing system (100) to have data stored and/or a graphic image formed thereon. As used herein, for ease of explanation only, the present radiation imageable thermochromic coating will be described in the context of coating an optical disc such as a compact disc (CD) or a digital video disc (DVD). However, it will be understood that the present radiation imageable thermochromic coating may be applied to any number of desired substrates including, but in no way limited to, polymers, papers, metal, glass, ceramics, and the like.

As illustrated in FIG. 1, the media processing system (100) includes a housing (105) that houses a radiation generating device (110), which may be controllably coupled to a processor (125). The operation of the radiation generating device (110) may be controlled by the processor (125) and firmware (123) configured to selectively direct the operation of the radiation generating device. The exemplary media processing system (100) also includes hardware (not shown), such as spindles, motors, and the like, for placing a radiation imageable disc (130) in optical communication with the radiation generating device (110). The operation of the hardware (not shown) may also be controlled by firmware (123) accessible by the processor (125). The above-mentioned components will be described in further detail below.

As illustrated in FIG. 1, the media processing system (100) includes a processor (125) having firmware (123) associated therewith. As shown, the processor (125) and firmware (123) are shown communicatively coupled to the radiation generating device (110), according to one exemplary embodiment. Exemplary processors (125) that may be associated with the present media processing system (100) may include, without limitation, a personal computer (PC), a personal digital assistant (PDA), an MP3 player, or other such device. According to one exemplary embodiment, any suitable processor may be used, including, but in no way limited to a processor configured to reside directly on the media processing system. Additionally, as graphically shown in FIG. 1, the processor (125) may have firmware (123) such as software or other drivers associated therewith, configured to control the operation of the radiation generating device (110) to selectively apply radiation to the data storage medium (130). According to one exemplary embodiment, the firmware (123) configured to control the operation of the radiation generating device (110) may be stored on a data storage device (not shown) communicatively coupled to the processor (125) including, but in no way limited to, read only memory (ROM), random access memory (RAM), and the like.

As introduced, the processor (125) is configured to controllably interact with the radiation generating device (110). While FIG. 1 illustrates a single radiation generating device (110), any number of radiation generating devices may be incorporated in the media processing system (100). According to one exemplary embodiment, the radiation generating device (110) may include, but is in no way limited to a plurality of lasers configured for forming data on a CD and/or DVD, such as in a combo CD/DVD recording drive. More specifically, a combo CD/DVD recording drive configured to record on more than one type of media may be incorporated by the media processing system (100). For example, a DVD−R/RW (+/−) combo drive is also capable of recording CD-R/RW for example. In order to facilitate recording on more than one type of media, these combo CD/DVD recording drives include more than one laser. For example combo CD/DVD recording drives often contain 2 recording lasers: a first laser operating at approximately 780 nm for CD recordings and a second laser operating at approximately 650 nm for DVD recordings. Accordingly, the present media processing system (100) may include any number of lasers having wavelengths that may vary from between approximately 200 nm to approximately 1200 nm.

As mentioned previously, the present media processing system (100) includes a data storage medium in the form of a radiation imageable disc (130) disposed adjacent to the radiation generating device (110). According to one exemplary embodiment, the exemplary radiation imageable disc (130) includes first (140) and second (150) opposing sides. The first side (140) has a data surface formed thereon configured to store data while the second side (150) includes a radiation imageable surface having a three-layer radiation imageable thermochromic coating having two or more bleachable antenna dyes dispersed and/or dissolved in various layers of the coating, and a third antenna dye that remains active in the thermochromic coating both before and after a bleaching operation.

With respect to the first side (140) of the radiation imageable disc (130), the radiation generating device (110) may be configured to read existing data stored on the radiation imageable disc (130) and/or to store new data on the radiation imageable disc (130), as is well known in the art. As used herein, the term "data" is meant to be understood broadly as including the non-graphic information digitally or otherwise embedded on a radiation imageable disc. According to the present exemplary embodiment, data can include, but is in no way limited to, audio information, video information, photographic information, software information, and the like. Alternatively, the term "data" may also be used herein to describe information such as instructions a computer or other processor may access to form a graphic display on a radiation imageable surface.

In contrast to the first side of the radiation imageable disc (130), the second side of the radiation imageable disc (140) includes a multi-phase/layer radiation imageable coating exhibiting improved marking speed compared to traditional imageable coatings. According to one exemplary embodiment, the second side of the radiation imageable disc (140) includes at least two separate layers: a first layer comprising a bleachable antenna dye and a second layer comprising an antenna dye that remains active when said first phase antenna dye is bleached. According to one particular embodiment, described in detail below, the second side of the radiation imageable disc (140) includes two or more color forming layers containing bleachable antenna dyes dispersed and/or dissolved in various layers of the coating, and a third color forming layer containing an antenna dye that remains active in the thermochromic coating both before and after a bleaching operation.

Exemplary Coating Formulation

As mentioned above, the second side of the radiation imageable disc (140) includes a number of components forming at least two separate layers configured to be imaged by one or more lasers emitting radiation at a known wavelength. According to one exemplary embodiment, three separate layers forming the present coating formulation include but are in no way limited to leuco dyes and antenna dyes that may or may not be deactivated during the image forming process. According to one exemplary embodiment, the present antenna dye package includes three dyes: two dyes with different radiation absorbance maximums that can be bleached from said coating by a bleaching operation, and at least one dye that remains active when other dyes are bleached from the coating. Each of the three thermochromic layers of the present exemplary coating is described in more detail below.

Figure 2:
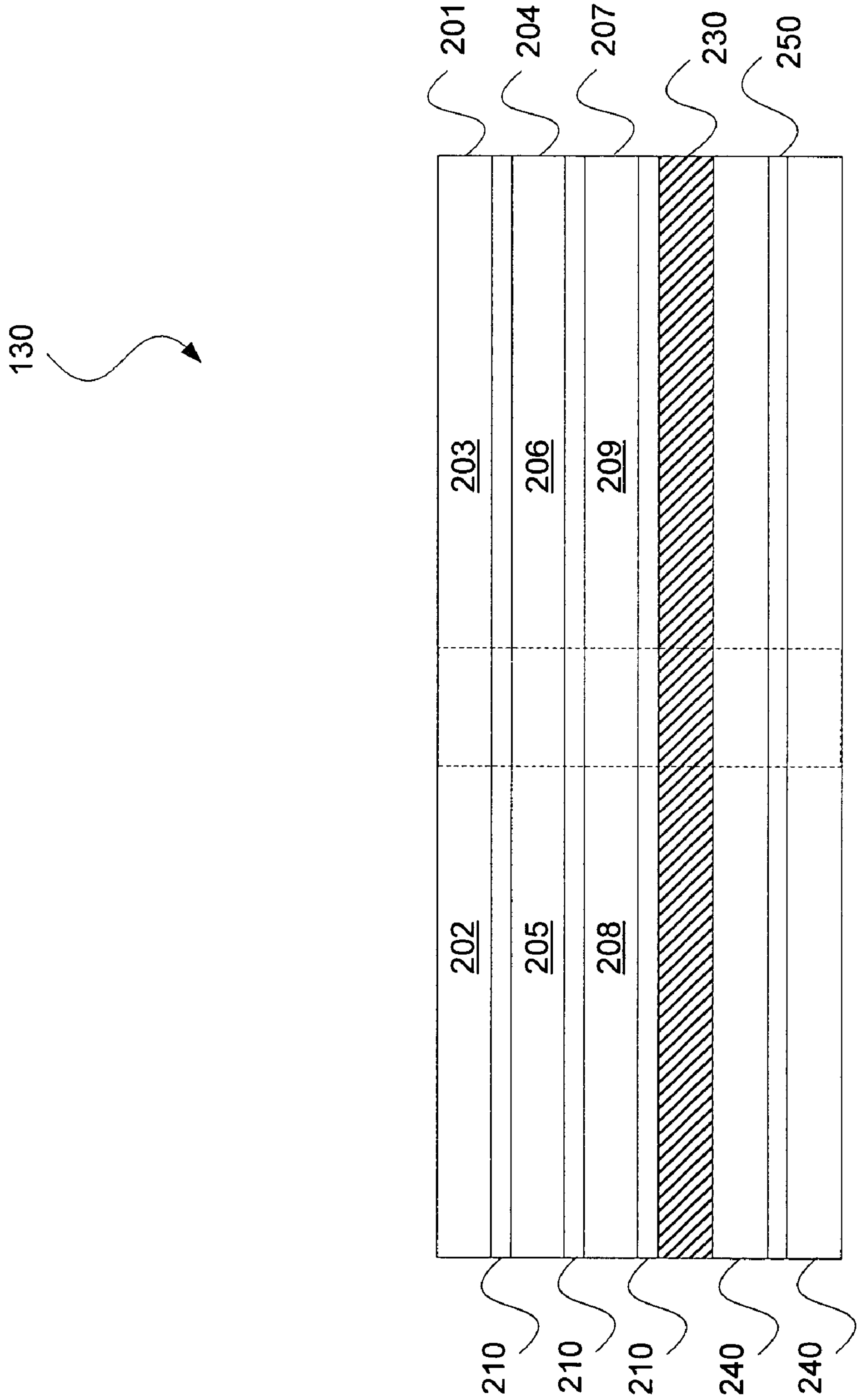
FIG. 2 is a side cross-sectional view of a multi-layered disc structure, according to one exemplary embodiment.

According to the present exemplary embodiment, a top thermochromic layer (201) includes, but is in no way limited to, an antenna dye (202) and a leuco dye (203). While the antenna dye (202) and the leuco dye (203) are illustrated in FIG. 2 as being compartmentalized in different sections of the top thermochromic layer (201), the antenna dye (202) and the leuco dye (203) are actually distributed in the top layer, as will be described in further detail below. Similar to the top thermochromic layer (201), a second thermochromic layer (204) includes a bleachable antenna dye (205) and a leuco dye (206). As illustrated in FIG. 2, the top or first thermochromic layer (201) and the second thermochromic layer (204) are separated by a thermal insulating layer (210). Continuing with FIG. 3, a third thermochromic layer (207) is also formed on the second side (140; FIG. 1) of the radiation imageable disc (130). According to the present exemplary embodiment, the third thermochromic layer (207) includes a non-bleachable antenna dye (208) and a leuco dye (209). Moreover, similar to the preceding structure, the second thermochromic layer (204) and the third thermochromic layer (207) are separated by a thermal insulating layer (210). Moreover, a thermal insulating layer (210) is formed between the third thermochromic layer (207) and the remainder of the radiation imageable disc (130). Specifically, the remaining layers of the radiation imageable disc (130) includes any number of the traditional structural layers included in a standard or writeable optical disc including, but in no way limited to, a polycarbonate plastic layer, recordable metallic layers, and/or protective acrylic layers. According to the exemplary embodiment illustrated in FIG. 2, the remaining layers of the radiation imageable disc (130) include, but are in no way limited to, a visual background and/or MLC (230), and a plurality of polycarbonate layers (240) sandwiching a data layer (250).

Continuing with the second side (140; FIG. 1) of the present exemplary radiation imageable disc (130), the antenna dyes (202, 205) in the first and second thermochromic layers (201, 204) are configured to be bleached when exposed to a bleaching operation, such as exposure to a bleaching lamp of a known wavelength. According to one exemplary embodiment, the antenna dyes (202, 205) in the first and second thermochromic layers (201, 204) are configured to be bleached when exposed to a diffuse or focused 200 nm-700 nm light. Additionally, according to one exemplary embodiment, the antenna dyes (202, 205) in the first and second thermochromic layers (201, 204) have different absorption maximums configured to sensitize the thermochromic layers (201, 204) to different light sources. Specifically, according to one exemplary embodiment, the antenna dye (205) in the first layer (201) has an absorbance maximum corresponding to the radiation of a first radiation source, and the said second antenna dye (205) has an absorbance maximum corresponding to a second radiation source. Additionally, according to the present exemplary embodiment, in order to reduce the number of radiation light sources used by the present exemplary system, the antenna dye (208) in the third layer (207) has an absorbance maximum corresponding to either the first or second radiation source mentioned above. Moreover, as mentioned above, the antenna dye (208) in the third layer (208) is not configured to be bleached when the first two antenna dyes (202, 205) are bleached. In one exemplary embodiment, the leuco dyes (203, 206, 209) are chosen, in no particular order, to mark cyan, yellow, and/or magenta colors. This configuration allows for the formation of full CYMK color images with the present exemplary system. The above-mentioned leuco dyes and antenna dyes are described in more detail below.

According to one exemplary embodiment, the leuco-phase of each thermochromic layer is present in the form of small particles dispersed uniformly in each of the exemplary thermochromic layers. According to one exemplary embodiment, the leuco-phase includes leuco-dye or alloy of leuco-dye with a mixing aid configured to form a lower melting eutectic with the leuco-dye.

According to one exemplary embodiment, the present radiation imageable thermochromic coating layers may have any number of leuco dyes including, but in no way limited to, fluorans, phthalides, amino-triarylmethanes, aminoxanthenes, aminothioxanthenes, amino-9,10-dihydro-acridines, aminophenoxazines, aminophenothiazines, aminodihydrophenazines, aminodiphenylmethanes, aminohydrocinnamic acids (cyanoethanes, leuco methines) and corresponding esters, 2-(p-hydroxyphenyl)-4,5-diphenylimidazoles, indanones, leuco indamines, hydrozines, leuco indigoid dyes, amino-2,3-dihydroanthraquinones, tetrahalo-p,p'-biphenols, 2-(p-hydroxyphenyl)-4,5-diphenylimidazoles, phenethylanilines, and mixtures thereof. According to one particular aspect of the present exemplary system and method, the leuco dye can be a fluoran, phthalide, aminotriarylmethane, or mixture thereof. Several nonlimiting examples of suitable fluoran based leuco dyes include, but are in no way limited to, 3-diethylamino-6-methyl-7-anilinofluorane, 3-(N-ethyl-p-toluidino)-6-methyl-7-anilinofluorane, 3-(N-ethyl-N-isoamylamino)-6-methyl-7-anilinofluorane, 3-diethylamino-6-methyl-7-(o,p-dimethylanilino)fluorane, 3-pyrrolidino-6-methyl-7-anilinofluorane, 3-piperidino-6-methyl-7-anilinofluorane, 3-(N-cyclohexyl-N-methylamino)-6-methyl-7-anilinofluorane, 3-diethylamino-7-(m-trifluoromethylanilino) fluorane, 3-dibutylamino-6-methyl-7-anilinofluorane, 3-diethylamino-6-chloro-7-anilinofluorane, 3-dibutylamino-7-(o-chloroanilino) fluorane, 3-diethylamino-7-(o-chloroanilino)fluorane, 3-di-n-pentylamino-6-methyl-7-anilinofluoran, 3-di-n-butylamino-6-methyl-7-anilinofluoran, 3-(n-ethyl-n-isopentylamino)-6-methyl-7-anilinofluoran, 3-pyrrolidino-6-methyl-7-anilinofluoran, 1-(3H)-isobenzofuranone, 4,5,6,7-tetrachloro-3,3-bis[2-[4-(dimethylamino)phenyl]-2-(4-methoxyphenyl)ethenyl], and mixtures thereof.

Aminotriarylmethane leuco dyes can also be used in the present invention such as tris(N,N-dimethylaminophenyl) methane (LCV); tris(N,N-diethylaminophenyl) methane (LECV); tris(N,N-di-n-propylaminophenyl) methane (LPCV); tris(N,N-dinbutylaminophenyl) methane (LBCV); bis(4-diethylaminophenyl)-(4-diethylamino-2-methyl-phenyl) methane (LV-1); bis(4-diethylamino-2-methylphenyl)-(4-diethylamino-phenyl) methane (LV-2); tris(4-diethylamino-2-methylphenyl) methane (LV-3); bis(4-diethylamino-2-methylphenyl)(3,4-dimethoxyphenyl) methane (LB-8); aminotriarylmethane leuco dyes having different alkyl substituents bonded to the amino moieties wherein each alkyl group is independently selected from C1-C4 alkyl; and aminotriaryl methane leuco dyes with any of the preceding named structures that are further substituted with one or more alkyl groups on the aryl rings wherein the latter alkyl groups are independently selected from C1-C3 alkyl.

Additional leuco dyes can also be used in connection with the present exemplary systems and methods and are known to those skilled in the art. A more detailed discussion of appropriate leuco dyes may be found in U.S. Pat. Nos. 3,658,543 and 6,251,571, each of which are hereby incorporated by reference in their entireties. Additionally examples may be found in Chemistry and Applications of Leuco Dyes, Muthyala, Ramaiha, ed.; Plenum Press, New York, London; ISBN: 0-306-45459-9, incorporated herein by reference.

According to one exemplary embodiment configured to produce a three layered structure exhibiting a cyan, magenta, and yellow color structure when imaged, specific leuco dyes may be incorporated. Specifically, according to one exemplary embodiment, a cyan thermochromic layer may be formed as the top layer, followed by a yellow thermochromic layer, and a magenta bottom layer.

According to one embodiment of the present exemplary system and method, one of the above-mentioned leuco-phases is uniformly dispersed or distributed in the matrix phase of each thermochromic layer as a separate phase. In other words, at ambient temperature, the leuco phase in each thermochromic layer is practically insoluble in matrix phase. Consequently, the leuco-dye and the acidic developer component of the matrix phase are contained in the separate phases and can not react with color formation at ambient temperature. However, upon heating with laser radiation, both phases melt and mix. Once mixed together, color is developed due to a reaction between the fluoran leuco dye and the acidic developer. According to one exemplary embodiment, when the leuco dye and the acidic developer melt and react, proton transfer from the developer opens a lactone ring of the leuco-dye, resulting in an extension of conjugate double bond system and color formation.

While the above-mentioned color formation is desired, the formation of the color is further controlled and facilitated by sensitizing the various phases of the resulting coating to a known radiation emission wavelength via the use of a plurality of antenna dyes, thereby providing maximum heating efficiency. According to one exemplary embodiment, the antenna dyes comprise a number of radiation absorbers configured to optimize development of the color forming composition upon exposure to radiation at a predetermined exposure time, energy level, wavelength, etc. More specifically, the radiation absorbing antenna dyes may act as an energy antenna providing energy to surrounding areas of the resulting coating upon interaction with an energy source of a known wavelength. Once energy is received by the radiation absorbing antenna dyes, the radiation is converted to heat to melt portions of the coating and selectively induce image formation. However, radiation absorbing dyes have varying absorption ranges and varying absorbency maximums where the antenna dye will provide energy most efficiently from a radiation source. Generally speaking, a radiation antenna that has a maximum light absorption at or in the vicinity of a desired development wavelength may be suitable for use in a thermochromic layer of the present system and method.

As a predetermined amount and frequency of radiation is generated by the radiation generating device (110) of the media processing system (100), matching the radiation absorbing energy antenna to the radiation wavelengths and intensities of the first and second radiation generating devices can optimize the image formation system. Optimizing the system includes a process of selecting components of the color forming composition that can result in a rapidly developable composition under a fixed period of exposure to radiation at a specified power.

According to the present exemplary embodiment a first antenna dye (202) disposed in the first thermochromic layer (201) has a maximum light absorption at or near the wavelength of a first radiation source, and the first antenna dye is bleachable. The term "bleachable" is meant to be understood broadly both here, and in the appended claims, to mean that when the dye is exposed to diffuse or focused light of a predetermined wavelength, the antenna dye is deactivated, no longer functioning as an antenna dye at said first radiation source's wavelength. According to the present exemplary embodiment, a second antenna dye (205) included in the second thermochromic layer (204) has a maximum light absorption at or near the wavelength of a second radiation source and is also bleachable. The third antenna dye (208), distributed in the third thermochromic layer (207), can have an absorbance maximum of either a first or second antenna dye. However, in contrast to the first and second antenna dyes (202, 205), the third antenna dye (208) that is distributed in the third thermochromic layer (207) is configured to remain active when the other two antenna dyes are bleached.

A number of dyes having varying absorbance maximums may be used in the above-mentioned coatings to act as radiation absorbing antenna dyes. According to one exemplary embodiment, a bleachable radiation absorbing antenna dye having absorbance maximum at approximately 780 nm that may be incorporated into the present antenna dye package includes, but is in no way limited to, a dye from American Dye Source: Near Infrared Laser Dye ADS775PI 2-[2-[2-chloro-3-[(1,3-dihydro-3,3-dimethyl-1-propyl-2H-indol-2-ylidene)-ethylidene]-1-cyclohexen-1-yl]-ethenyl]-3,3-dimethyl-1-propylindolium iodide].

Additionally, according to one exemplary embodiment, a bleachable radiation absorbing antenna dye having absorbance maximum at approximately 650 nm that may be incorporated into the present antenna dye package includes, but is in no way limited to, a dye from Organica, dye code Code 07830, 1,1'-Dibutyl-3,3,3',3'tetramethylindadicarbocyanine hexafluorophosphate.

According to one exemplary embodiment, a possible third antenna dye that remains active while the other dyes are bleached includes, but is no way limited to any class of stable antenna dyes that absorb at approximately 780 nm or 650 nm. More particularly, According to one exemplary embodiment, radiation absorbing antenna dyes having absorbance maximums at approximately 780 nm that may be incorporated into the present antenna dye package include, but are in no way limited to, indocyanine IR-dyes such as IR780 iodide (Aldrich 42,531-1) (1) (3H-Indolium, 2-[2-[2-chloro-3-[(1,3-dihydro-3,3-dimethyl-1-propyl-2H-indol-2-ylidene)ethylidene]-1-cyclohexen-1-yl]ethenyl]-3,3-dimethyl-1-propyl-, iodide (9CI)), IR783 (Aldrich 54,329-2) (2) (2-[2-[2-Chloro-3-[2-[1,3-dihydro-3,3-dimethyl-1-(4-sulfobutyl)-2H-indol-2-ylidene]-ethylidene]-1-cyclohexen-1-yl]-ethenyl]-3,3-dimethyl-1-(4-sulfobutyl)-3H-indolium hydroxide, inner salt sodium salt). Additionally, phthalocyanine or naphthalocyanine IR dyes such as Silicon 2,3-naphthalocyanine bis(trihexylsiloxide) (CAS No. 92396-88-8) (Lambda max-775 nm) may be used.

Further, exemplary radiation absorbing antenna dyes having absorbance maximums at approximately 650 nm that may be incorporated into the present antenna dye package include, but are in no way limited to, dye 724 (3H-Indolium, 2-[5-(1,3-dihydro-3,3-dimethyl-1-propyl-2H-indol-2-ylidene)-1,3-pentadienyl]-3,3-dimethyl-1-propyl-, iodide) C (lambda max=642 nm), dye 683 (3H-Indolium, 1-butyl-2-[5-(1-butyl-1,3-dihydro-3,3-dimethyl-2H-indol-2-ylidene)-1,3-pentadienyl]-3,3-dimethyl-, perchlorate C (lambda max=642 nm), dyes derived from phenoxazine such as Oxazine 1 (Phenoxazin-5-ium, 3,7-bis (diethylamino)-, perchlorate) "C (lambda max=645 nm), both of which are commercially available from "Organica Feinchemie GmbH Wollen." Appropriate antenna dyes applicable to the present exemplary system and method may also include but are not limited to phthalocyanine dyes with light absorption maximum at/or in the vicinity of 650 nm.

Exemplary Coating Formation

As mentioned above, the present imageable thermochromic structure includes a number of layers formed on a desired substrate, such as an optical disc. In general, a method of forming each of the imageable thermochromic coatings includes preparing a polymer matrix with an acidic activator species dissolved therein, preparing a low-melting eutectic of a leuco-dye, evenly distributing the low-melting eutectic of a leuco-dye in the radiation curable polymer matrix, and evenly distributing the radiation absorbing antenna dyes in the coating.

With each of the thermochromic coatings prepared for the various thermochromic layers (201, 204, 207), the coatings may be formed on an optical disc or other desired substsrate. According to the exemplary formation method, the desired structure may be formed by first, depositing the bottom thermochromic layer (207), having a non-bleachable radiation absorbing dye, onto an insulating layer, such as a polymer, formed on a desired substrate. Once the bottom thermochromic layer has been formed on the desired substrate, another insulating layer may be formed, followed by the deposition of the middle thermochromic layer having a bleachable radiation absorbing dye. This layer is again followed by the formation of yet another insulating layer and the deposition of the top thermochromic layer having a bleachable radiation absorbing dye. According to one exemplary embodiment, the above-mentioned thermochromic coatings and the thermal insulating layers may be applied to a desired substrate using any number of known coating systems and methods including, but in no way limited to, doctor blade coating, gravure coating, reverse roll coating, meyer rod coating, extrusion coating, curtain coating, air knife coating, and the like.

Figure 3:
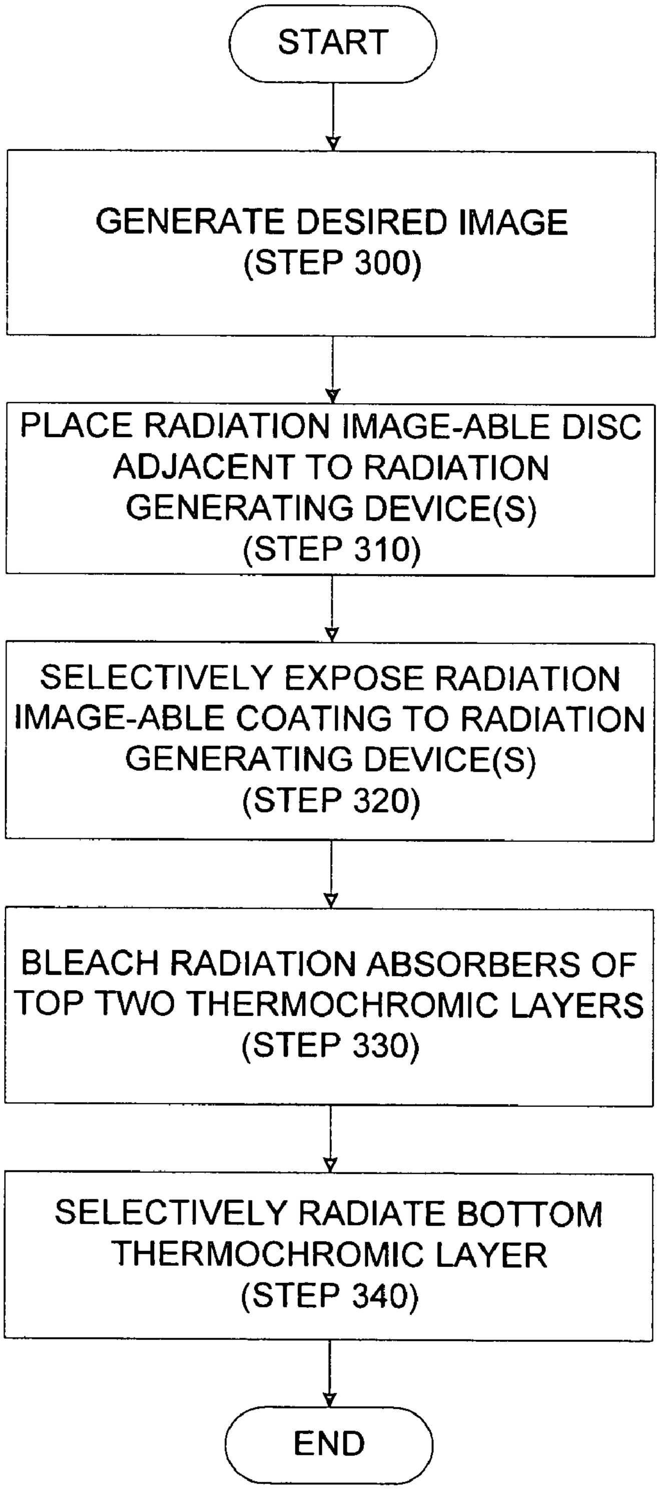
FIG. 3 is a flow chart illustrating a method for forming an image on a radiation imageable coating, according to one exemplary embodiment.

Once the above-mentioned coating is formed on a radiation imageable disc (130; FIG. 1), data may be formed on the data surface of the first side (140), and/or a desired image may be formed via selective radiation exposure on the second side (150). FIG. 3 illustrates one exemplary method for forming a desired image on the second side (150) of the radiation imageable disc (130), according to one exemplary embodiment. As illustrated in FIG. 3, the image formation method begins by first generating the desired image (step 300). According to one exemplary embodiment, generating the desired image may include forming a graphical representation of the desired image using any number of user interfaces and converting the graphical representation into a number of machine controllable commands using the firmware (123; FIG. 1) and/or the processor (125; FIG. 1) of the media processing system (100; FIG. 1).

Continuing with FIG. 3, the radiation imageable disc may then be placed adjacent to the radiation generating device(s) (110; FIG. 1) with the radiation imageable coating in optical communication with the radiation generating device(s) (step 310). With the radiation imageable coating in optical communication with the radiation generating device(s) (step 310), the radiation imageable coating may then be selectively exposed to the radiation generating device(s) (step 320).

As mentioned previously, the first and second thermochromic layers (201, 204; FIG. 2) are sensitized to rapidly form a desired color when exposed to electromagnetic radiation of a specified wavelength. According to one exemplary embodiment, the step of selectively exposing the radiation imageable coating to one or more radiation generating devices (step 320) includes applying electromagnetic radiation (of, for example, 650 nm) to the top thermochromic layer (201; FIG. 2) to mark Cyan. Simultaneously or sequentially, electromagnetic radiation (of, for example, 780 nm) is exposed to the middle or second thermochromic layer (204; FIG. 2) to mark Yellow components of a desired image. The above mentioned radiation can be highly focused, to a spot size of about 12 um-24 um FWHM. The insulating layer (210) of the present exemplary structure prevents thermal energy generated in the first and/or second thermochormic layer(s) (201, 204; FIG. 2) from unintentionally marking the third thermochromic layer (207; FIG. 2). According to the present exemplary embodiment, the 650 nm and 780 nm electromagnetic radiation will be provided by one or more lasers, as are commonly available in optical disc drives.

Following exposure of the first and second thermochromic layers to the radiation generating device(s), the radiation imageable coating is then exposed to a bleaching source, such as a light of a known wavelength, to bleach the radiation absorbers of the top two thermochromic layers (step 330). According to one exemplary embodiment, a diffuse or focused light having a wavelength between approximately 200 nm and 700 nm may be applied to the substrate to bleach the absorber dye from the first and second thermochromic layers (201, 204; FIG. 2). As discussed previously, the dyes and their matrix have been chosen for the ability to bleach when exposed to the known wavelength range of light.

Once the absorber dye has been bleached in the first and second thermochromic layers (201, 204; FIG. 2), a second selective exposure to the radiation generating device(s) then follows (step 340) to mark the third thermochromic layer (207; FIG. 2). According to one exemplary embodiment, the method illustrated in FIG. 3 allows for selective generation of a full color image on any number of desired substrates including, but in no way limited to, an optical disc.

According to the present exemplary embodiment, the radiation imageable thermochromic coating made with the above-mentioned thermochromic structure exhibits improved marking speed when compared to traditional imageable thermochromic coatings. Radiation of approximately 650 nm can be applied to the top layer to mark cyan and simultaneously or sequentially radiation of approximately 780 nm can be applied to the second layer to mark yellow. Following the marking of the top two layers, diffuse or direct light between 200 nm and 700 nm, preferably between 380 nm and 400 nm, is applied to the media to bleach the antenna dyes from the top two layers. Radiation of either 650 nm or 780 nm is then applied to the bottom layer to mark magenta. This exemplary system can be used to provide a stable, excellent color image label that has low background color.

The preceding description has been presented only to illustrate and describe the present method and apparatus. It is not intended to be exhaustive or to limit the disclosure to any precise form disclosed. Many modifications and variations are possible in light of the above teaching. It is intended that the scope of the disclosure be defined by the following claims.

What is claimed is:

1. A radiation imageable coating comprising:

a first thermochromic layer including a bleachable antenna dye; and a second thermochromic layer including a non-bleachable antenna dye.

2. The coating of claim 1, wherein said bleachable antenna dye has an absorbance maximum wavelength of one of approximately 780 nm or approximately 650 nm.

3. The coating of claim 1, wherein said non-bleachable antenna dye has an absorbance maximum wavelength of one of approximately 780 nm or approximately 650 nm.

4. The coating of claim 1, further comprising a third thermochromic layer including a bleachable antenna dye;

wherein said third thermochromic layer is disposed between said first thermochromic layer and said second thermochromic layer; and wherein said bleachable dye in said third thermochromic layer has an absorbance maximum wavelength of one of approximately 780 nm or approximately 650 nm;

said absorbance maximum wavelength of said bleachable dye in said third thermochromic layer being different than said absorbance maximum wavelength of said bleachable dye in said first thermochromic layer.

5. The coating of claim 4, wherein said bleachable dye in said third thermochromic layer and said bleachable dye in said first thermochromic layer are both configured to be bleached when exposed to a known wavelength of light.

6. The coating of claim 5, wherein said known wavelength of light configured to bleach said bleachable dye in said first and third thermochromic layers comprises one of a diffuse or focused light.

7. The coating of claim 6, wherein said known wavelength of light configured to bleach said bleachable dye in said first and third thermochromic layers comprises a bleach wavelength between 200 nm and 700 nm.

8. The coating of claim 4, wherein each of said first, second, and third thermochromic layers are each configured to form a different color selected from the group consisting of cyan, magenta, and yellow when exposed to thermal energy.

9. The coating of claim 1, wherein said first thermochromic layer and said second thermochromic layer are separated by an insulating layer.

10. The coating of claim 9, wherein said insulating layer comprises a polymer.

11. A radiation imageable coating comprising:

a first thermochromic layer including a bleachable antenna dye;

a second thermochromic layer including a bleachable antenna dye;

a third thermochromic layer including a non-bleachable antenna dye;

a first insulating layer disposed between said first thermochromic layer and said second thermochromic layer;

a second insulating layer disposed between said second thermochromic layer and said third thermochromic layer;

wherein said second thermochromic layer is disposed between said first thermochromic layer and said third thermochromic layer;

wherein an absorbance maximum wavelength of said bleachable dye in said second thermochromic layer is different than an absorbance maximum wavelength of said bleachable dye in said first thermochromic layer;

wherein said bleachable dye in said second thermochromic layer and said bleachable dye in said first thermochromic layer are both configured to be bleached when exposed to a single known wavelength of light; and wherein each of said first, second, and third thermochromic layers are each configured to form a different color selected from the group consisting of cyan, magenta, and yellow when exposed to thermal energy.

12. The coating of claim 11, wherein said first and second bleachable antenna dyed each have an absorbance maximum wavelength of one of approximately 780 nm or approximately 650 nm.

13. The coating of claim 11, wherein said non-bleachable antenna dye has an absorbance maximum wavelength of one of approximately 780 nm or approximately 650 nm.

14. The coating of claim 11, wherein said known wavelength of light configured to bleach said bleachable dye in said first and third thermochromic layers comprises one of a diffuse or focused light.

15. The coating of claim 11, wherein said known wavelength of light configured to bleach said bleachable dye in said first and third thermochromic layers comprises a bleach wavelength between 200 nm and 700 nm.

* * * * *